United States Patent
Liu et al.

(10) Patent No.: US 9,954,488 B2
(45) Date of Patent: Apr. 24, 2018

(54) VARAINDUCTOR, VOLTAGE CONTROLLED OSCILLATOR INCLUDING THE VARAINDUCTOR, AND PHASE LOCKED LOOP INCLUDING THE VARAINDUCTOR

(71) Applicant: TAIWAN SEMICONDUCTOR MANUFACTURING COMPANY, LTD., Hsinchu (TW)

(72) Inventors: Yi-Hsuan Liu, Hualien (TW); Hsieh-Hung Hsieh, Taipei (TW); Chewn-Pu Jou, Hsinchu (TW); Fu-Lung Hsueh, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 13/837,184

(22) Filed: Mar. 15, 2013

(65) Prior Publication Data

US 2014/0266344 A1 Sep. 18, 2014

(51) Int. Cl.
*H03B 5/08* (2006.01)
*H03B 5/18* (2006.01)
(Continued)

(52) U.S. Cl.
CPC ......... *H03B 5/1256* (2013.01); *H03B 5/1212* (2013.01); *H03B 5/1228* (2013.01);
(Continued)

(58) Field of Classification Search
CPC .......... H03B 2201/0216; H03B 5/1256; H03B 5/1212; H03B 5/1228; H03J 3/20; H03J 3/22; H01F 2021/125
(Continued)

(56) References Cited

U.S. PATENT DOCUMENTS 6,597,248 B2 * 7/2003 Shirai .................. H03B 5/1228
331/117 FE
7,132,901 B2 11/2006 Cojocaru
(Continued)

FOREIGN PATENT DOCUMENTS

CN 1527476 9/2004
JP 2002151953 * 5/2002

OTHER PUBLICATIONS

Shiao, Yi-Shao Jerry et al., "A 100-GHz Varactorless CMOS VCO Using Source Degeneration", International Microwave Symposium, Jun. 2102.

(Continued)

*Primary Examiner* — Richard Tan
(74) *Attorney, Agent, or Firm* — Hauptman Ham, LLP

(57) ABSTRACT

A varainductor including a signal line disposed over a substrate. The varainductor further includes a first ground plane over the substrate, the first ground plane disposed on a first side of the signal line, and a second ground plane over the substrate, the second ground plane disposed on a second side of the signal line opposite the first side of the signal line. The varainductor further includes a first floating plane over the substrate, the first floating plane disposed between the first ground plane and the signal line, and a second floating plane over the substrate, the second floating plane disposed between the second ground plane and the signal line. The varainductor further includes an array of switches, the array of switches is configured to selectively connect the first ground plane to the first floating plane, and to selectively connect the second ground plane to the second floating plane.

19 Claims, 9 Drawing Sheets

(51) Int. Cl.
*H03B 5/12* (2006.01)
*H03J 3/20* (2006.01)
*H03J 3/22* (2006.01)
*H01F 21/12* (2006.01)

(52) U.S. Cl.
CPC .................. *H01F 2021/125* (2013.01); *H03B 2201/0216* (2013.01); *H03J 3/20* (2013.01); *H03J 3/22* (2013.01)

(58) Field of Classification Search
USPC ........ 331/36 R, 36 L, 108 A, 107 SL, 117 R, 331/117 FE, 167, 181; 336/137, 138, 176
See application file for complete search history.

(56) References Cited

U.S. PATENT DOCUMENTS

| | | | | |
|---|---|---|---|---|
| 7,323,948 B2 * | 1/2008 | Ding | .................. | H01L 23/5223 257/531 |
| 7,342,464 B2 * | 3/2008 | Hino | .............................. | 331/167 |
| 7,460,001 B2 * | 12/2008 | Jessie | .................. | H01F 17/0006 257/E27.046 |
| 8,193,878 B2 * | 6/2012 | Ding | ...................... | H01P 1/184 333/161 |
| 2002/0008594 A1 | 1/2002 | Shirai | | |
| 2003/0210101 A1 * | 11/2003 | McCorquodale | ... | H01F 17/0006 331/117 FE |
| 2006/0071732 A1 * | 4/2006 | Komurasaki et al. | ........ | 331/167 |
| 2009/0189725 A1 * | 7/2009 | Ding | ...................... | H01F 21/005 336/137 |
| 2009/0295491 A1 * | 12/2009 | Tsai et al. | ........................ | 331/51 |
| 2010/0271086 A1 * | 10/2010 | Bao et al. | ..................... | 327/144 |
| 2010/0321073 A1 * | 12/2010 | Cheung | ......................... | 327/155 |
| 2012/0212300 A1 | 8/2012 | Tang et al. | | |
| 2013/0271230 A1 * | 10/2013 | Li | ........................ | H03B 5/1228 331/117 FE |

OTHER PUBLICATIONS

Office Action dated Apr. 25, 2016 from corresponding No. CN 201310323082.9.

* cited by examiner

US 9,954,488 B2

VARAINDUCTOR, VOLTAGE CONTROLLED OSCILLATOR INCLUDING THE VARAINDUCTOR, AND PHASE LOCKED LOOP INCLUDING THE VARAINDUCTOR

BACKGROUND

A phase locked loop (PLL) is a control system configured to generate an output signal whose phase is related to a phase of a reference signal. PLLs are used in demodulator systems, tone detectors, and frequency synthesizers. PLLs are also used in digital applications which include a high frequency period signal to synchronize events within a circuit.

PLLs include a voltage controlled oscillator (VCO) configured to adjust a frequency of the output signal based on a control signal. In some instances, the VCO includes a varactor. A varactor is a diode having a variable capacitance. In some instances, a metal-oxide-semiconductor (MOS) varactor is used in the VCO. A transmission-line-based inductor is also included in the VCO for high frequency applications, e.g., millimeter-wave region, in some instances.

A Q factor is a measure of an amount of energy loss relative to the energy stored in a resonator, such as the varactor. As the Q factor decreases, the oscillations in the varactor are damped more quickly. In some instances, if the Q factor is too low, the varactor cannot initiate oscillation in the VCO, which inhibits the PLL from locking the output signal to the reference signal. As a frequency of the reference signal increases, the Q factor of the MOS varactor decreases. This decrease potentially prevents initiation of oscillation in high frequency applications.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
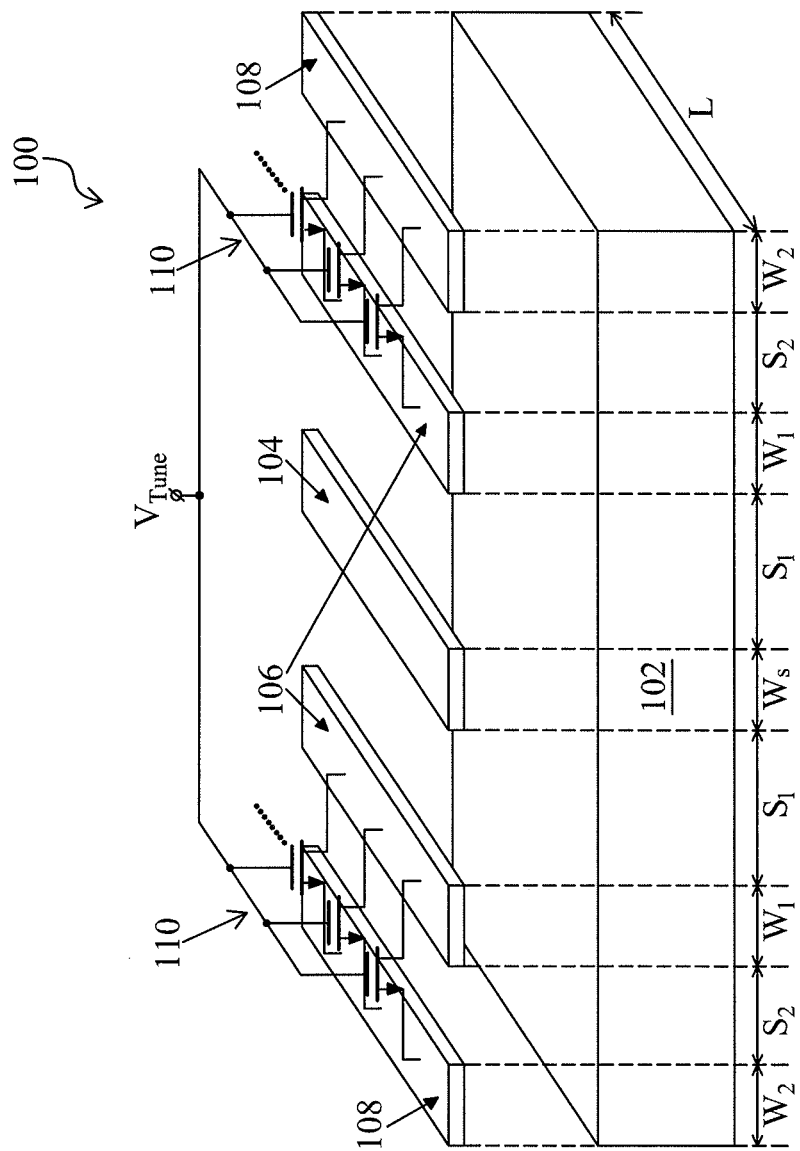
FIG. 1 is a perspective view of a varainductor in accordance with one or more embodiments.

FIG. 1 is a perspective view of a varainductor 100 in accordance with one or more embodiments. Varainductor 100 includes a substrate 102 and a signal line 104 disposed over the substrate and extending in a first direction. Signal line 104 is configured to receive a DC operating voltage and signal. A pair of floating planes 106 is disposed over substrate 102 and extends in the first direction parallel to signal line 104. Each of the pair of floating planes 106 is configured to be electrically floating. One of the pair of floating planes 106 is disposed on each side of signal line 104. A pair of ground planes 108 is disposed over substrate 102 and extends in the first direction parallel to signal line 104. Each of the pair of ground planes 108 is configured to receive a ground or reference voltage. One of the pair of ground planes 108 is disposed on each side of signal line 104 with one of the pair of floating planes 106 positioned between the signal line and the ground plane. An array of switches 110 is disposed over substrate 102 and is capable of electrically connecting one of the pair of ground planes 108 with a respective one of the pair of floating planes 106. Varainductor 100 is configured to receive a switch control signal Vtune, which is electrically connected to array of switches 110. Switch control signal Vtune determines a level of electrical connectivity between ground plane 108 and the respective floating plane 106, to adjust an inductance level of varainductor 100. A dielectric material (not shown) is disposed between substrate 102, signal line 104, floating planes 106 and ground planes 108.

In some embodiments, substrate 102 comprises an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 102 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

Signal line 104 comprises a conductive material. In some embodiments, signal line 104 comprises copper, aluminum, tungsten, polysilicon, a conductive polymer, other suitable conductive materials, or combinations therefore. Signal line 104 is configured to receive the DC operating voltage and signal of varainductor 100. In some embodiments, varainductor 100 is used in a voltage controlled oscillator (VCO) of a phase locked loop (PLL). Signal line 104 has a length L in the first direction. In some embodiments, the length L ranges from about 10 micrometers (μm) to about 300 μm. As the length L of signal line 104 increases, a total inductance of varainductor 100 also increases. Signal line 104 has a width Ws in a second direction perpendicular to the first direction. In some embodiments, the width Ws ranges from about 2 μm to about 6 μm. As the width Ws of signal line 104 increases, a characteristic impedance of varainductor 100 decreases. The characteristic impedance is a ratio of a voltage and a current traveling along a transmission line. Characteristic impedance is directly related to the total inductance of varainductor 100.

Each floating plane 106 comprises a conductive material. In some embodiments, each floating plane 106 comprises copper, aluminum, tungsten, polysilicon, a conductive polymer, other suitable conductive materials, or combinations therefore. In some embodiments, each floating plane 106 comprises a same material as signal line 104. In some embodiments, at least one floating plane 106 comprises a different material from signal line 104. Each floating plane 106 has a length L in the first direction. In some embodiments, the length L ranges from about 10 micrometers (μm) to about 300 μm. The length L of the floating planes 106 is substantially equal to the length L of signal line 104. Each floating plane 106 has a width W1 in the second direction. In some embodiments, the width W1 ranges from about 2 μm to about 30 μm. As the width W1 of floating planes 106 increases, a grounding capability of varainductor 100 increases, which increases the Q factor of the varainductor. In some embodiments, the width W1 of floating planes 106 is the same as the width Ws of signal line 104. In some embodiments, the width W1 of floating planes 106 is different from the width Ws of signal line 104. Floating planes 106 are spaced from signal line 104 in the second direction by a first spacing distance S1. In some embodiments, the first spacing distance S1 ranges from about 2 μm to about 30 μm. As the first spacing distance S1 between floating planes 106 and signal line 104 increases, the characteristic impedance increases.

Each ground plane 108 comprises a conductive material. In some embodiments, each ground plane 108 comprises copper, aluminum, tungsten, polysilicon, a conductive polymer, other suitable conductive materials, or combinations therefore. In some embodiments, each ground plane 108 comprises a same material as signal line 104 or floating planes 106. In some embodiments, at least one ground plane 108 comprises a different material from signal line 104 or floating planes 106. Each ground plane 108 has a length L in the first direction. In some embodiments, the length L ranges from about 10 micrometers (μm) to about 300 μm. The length L of the ground planes 108 is substantially equal to the length of signal line 104. Each ground plane 108 has a width W2 in the second direction. In some embodiments, the width W2 ranges from about 4 μm to about 30 μm. As the width W2 of ground planes 108 increases, a grounding capability of varainductor 100 increases, which increases the Q factor of the varainductor. In some embodiments, the width W2 of ground planes 108 is the same as the width Ws of signal line 104 or the width W1 of floating planes 106. In some embodiments, the width W2 of ground planes 108 is different from the width Ws of signal line 104 or the width W1 of floating planes 106. Ground planes 108 are spaced from adjacent floating planes 106 in the second direction by a second spacing distance S2. In some embodiments, the second spacing distance S2 ranges from about 2 μm to about 30 μm. As the second spacing distance S2 between floating planes 106 and ground planes 108 increases, a tuning range of varainductor 100 is increased. In some embodiments, the first spacing distance S1 is equal to the second spacing distance S2. In some embodiments, the first spacing distance S1 is different from the second spacing distance S2.

Array of switches 110 comprises an array of switching elements configured to selectively connect ground plane 108 to a respective floating plane 106. In some embodiments, the switching elements comprise transistors, thyristors, micro-electromechanical systems (MEMS), or other suitable switching elements. Each switch of the array of switches 110 is configured to receive switch control signal Vtune. In some embodiments, array of switches 110 is configured to increase electrical connectivity between floating plane 106 and ground plane 108 as a voltage level of switch control signal Vtune increases. In some embodiments, array of switches 110 is configured to increase electrical connectivity between floating plane 106 and ground plane 108 as the voltage level of switch control signal Vtune decreases. In some embodiments, array of switches 110 is configured to gradually adjust electrical connectivity between floating plane 106 and ground plane 108 as the voltage level of switch control signal Vtune changes. In some embodiments, array of switches 110 is configured to adjust electrical connectivity between floating plane 106 and ground plane 108 in a digital manner as the voltage level of switch control signal Vtune changes.

The dielectric material is disposed between the various elements of varainductor 100. The dielectric material is configured to provide electrical insulation between signal line 104, floating planes 106 and ground planes 108. In some embodiments, the dielectric material is a low-k dielectric material. In some embodiments, the dielectric material has a k value less than 3.5. In some embodiments, the dielectric material has a k value less than 2.5. Suitable low-k dielectric materials include fluorinated silica glass (FSG); carbon doped silicon oxide, BLACK DIAMOND® (Applied Materials of Santa Clara, Calif.), xerogel, aerogel, amorphous fluorinated carbon, parylene, bis-benzocyclobutenes (BCB), SILK® (Dow Chemical, Midland, Mich.), polyimide, porous polymeric materials, other suitable materials or combinations thereof. In some embodiments, the low-k dielectric material reduces tuning problems within varainductor 100. In some embodiments, each of signal line 104, floating planes 106 and ground planes 108 are formed in a same plane in the dielectric material. In some embodiments, at least one of signal line 104, floating planes 106 or ground planes 108 are formed in a different plane in the dielectric layer from at least another of the signal line, the floating planes or the ground planes.

Figure 2:
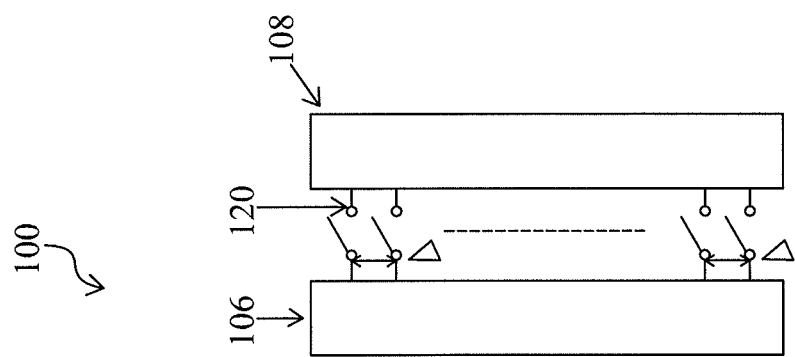
FIG. 2 is a top view of a varainductor in accordance with one or more embodiments.
Figure 2:
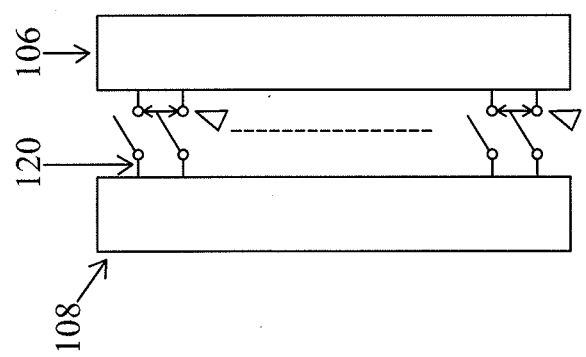

FIG. 2 is a top view of varainductor 100 in accordance with one or more embodiments. Varainductor 100 includes switches 120 between floating plane 106 and a respective ground plane 108. Switches 120 are individual switches from array of switches 110 (FIG. 1). As mentioned above, switches 120 are able to be implemented using a variety of switching elements including transistors, thyristors, MEMS, or other suitable switching elements. In some embodiments, every switch 120 has substantially the same structure. In some embodiments, at least one switch 120 has a different structure than at least one other switch 120. A different structure means a different type of switching element, a different dimension, a different threshold voltage, or another structural difference within the switching elements.

Each switch 120 is spaced from an adjacent switch by a switch spacing distance Δ. As a resistance between ground plane 108 and floating plane 106 decreases, the tuning range of varainductor 100 increases. A larger switch spacing distance Δ results in fewer switches 120 between floating plane 106 and ground plane 108, which in turn increases the resistance between the ground plane and the floating plane. To maintain a low resistance between ground plane 108 and floating plane 106, switch spacing distance Δ is made as small as design rules and a critical dimension of production capabilities permit to maximize the tuning range of varainductor 100. In some embodiments, for a floating plane 106 having a length of approximately 100 μm, sixteen switches are positioned between the floating plane and ground plane 108.

Figure 3:
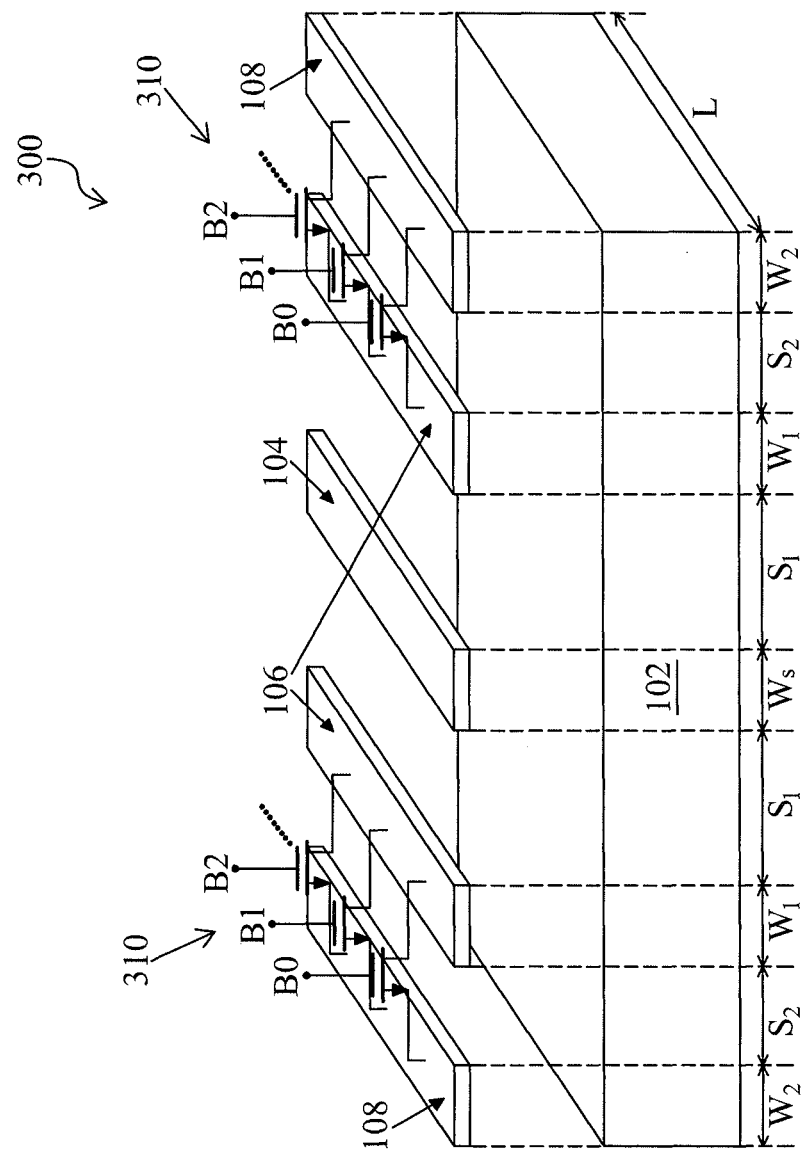
FIG. 3 is a perspective view of a varainductor in accordance with one or more embodiments.

FIG. 3 is a perspective view of a varainductor 300 in accordance with one or more embodiments. Varainductor 300 is similar to varainductor 100, except array of switches 110 is replaced with array of switches 310. Array of switches 310 is configured to facilitate bit control of the switches between floating plane 106 and the respective ground plane 108. In the embodiment of FIG. 3, each switch of array of switches 310 is configured to receive a different control signal to selectively activate/de-activate the switch. In some embodiments, a first group of switches of array of switches 310 is configured to receive a first control signal and a second group of switches of array of switches 310 is configured to receive a second control signal different from the first control signal. In some embodiments, an external circuit is used to generate the individual switch control signals for varainductor 300. In some embodiments, at least one switch of the array of switches 310 has a different voltage drop across the switch than at least another switch of the array of switches.

Bit control of the electrical connection between ground plane 108 and floating plane 106 enables varainductor 300 to have a more finely adjustable capacitance between the ground plane 108 and the floating plane 106 in comparison with varainductor 100. In some embodiments, bit control facilitates more efficient power consumption because the individual switch control signals for each switch of array of switches 310 has a lower power consumption than switch control signal Vtune of varainductor 100.

Figure 4:
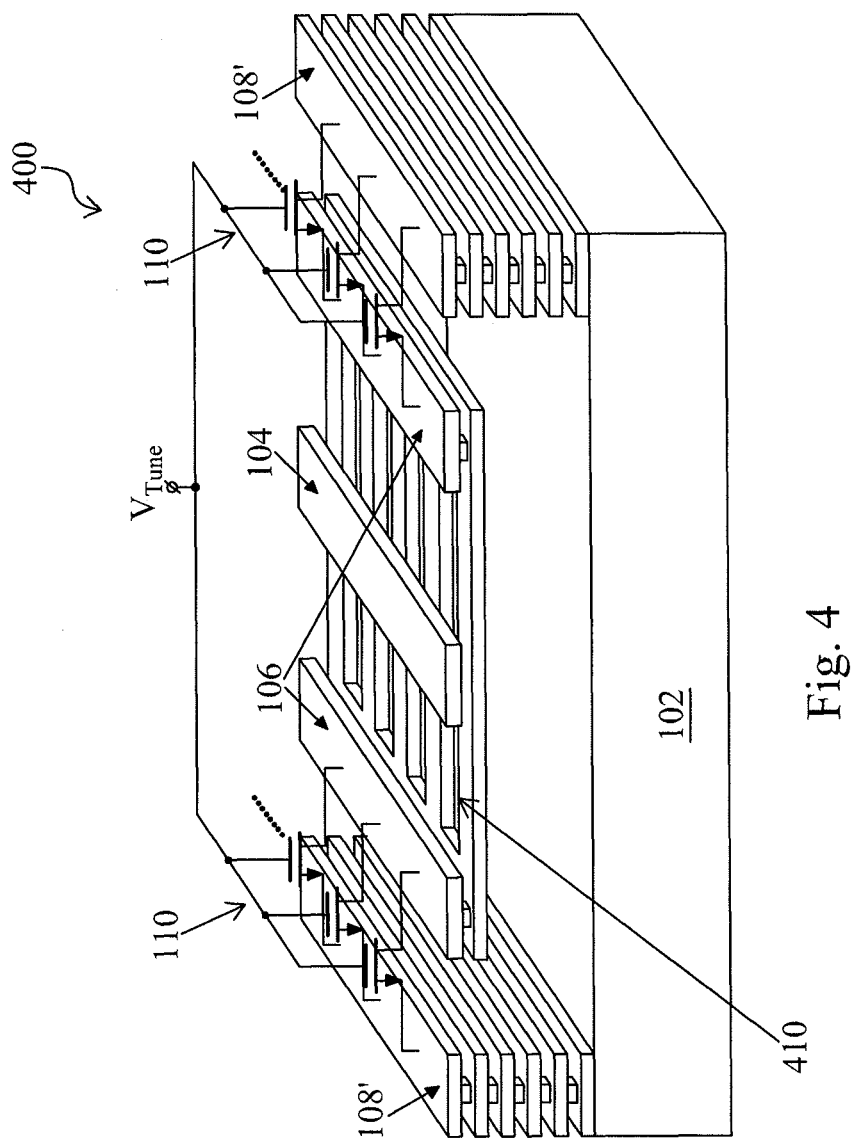
FIG. 4 is a perspective view of a varainductor in accordance with one or more embodiments.

FIG. 4 is a perspective view of a varainductor 400 in accordance with one or more embodiments. Varainductor 400 is similar to varainductor 100 (FIG. 1), except ground planes 108 are replaced with ground planes 108'. Ground planes 108' differ from ground planes 108 in that ground planes 108' are formed by a stack of conductors in different planes of the dielectric material with the conductors electrically connected to one another by vias. Ground planes 108'distribute a total area of a grounding conductor in three dimensions instead of two dimensions, as with ground planes 108. The three dimensional distribution reduces an overall area of varainductor 400 in comparison with varainductor 100.

Varainductor 400 also differs from varainductor 100 in that varainductor 400 includes a shielding plane 410 between signal line 104 and substrate 102. Shielding plane 410 extends between signal line 104 and substrate 102 from one floating plane 106 to the other floating plane 106. Shielding plane 410 is electrically connected to floating planes 106 by vias through the dielectric material. Shielding plane 410 is a slot type shielding plane where the slots account for approximately 50% of the total area under signal line 104. In some embodiments, shielding plate 410 includes slots which account for more or less than 50% of the total area under signal line 104. In some embodiments, shielding plate 410 is a solid shielding plate with no slots. In some embodiments, shielding plane 410 does not extend an entire distance from one floating plane 106 to the other floating plane 106. In some embodiments, shielding plane 410 is electrically separated from at least one of floating planes 106. In some embodiments, shielding plane 410 is a different type of shielding plane, such as braided shielding structures or other suitable shielding structures. In some embodiments, more than one shielding plane 410 is disposed between signal line 104 and substrate 102. In some embodiments, the more than one shielding planes 410 are electrically connected to one another by vias through the dielectric material.

Although varainductor 400 is depicted having array of switches 110, one of ordinary skill in the art would recognize varainductor 400 having array of switches 310 is within the scope of this description.

Figure 5:
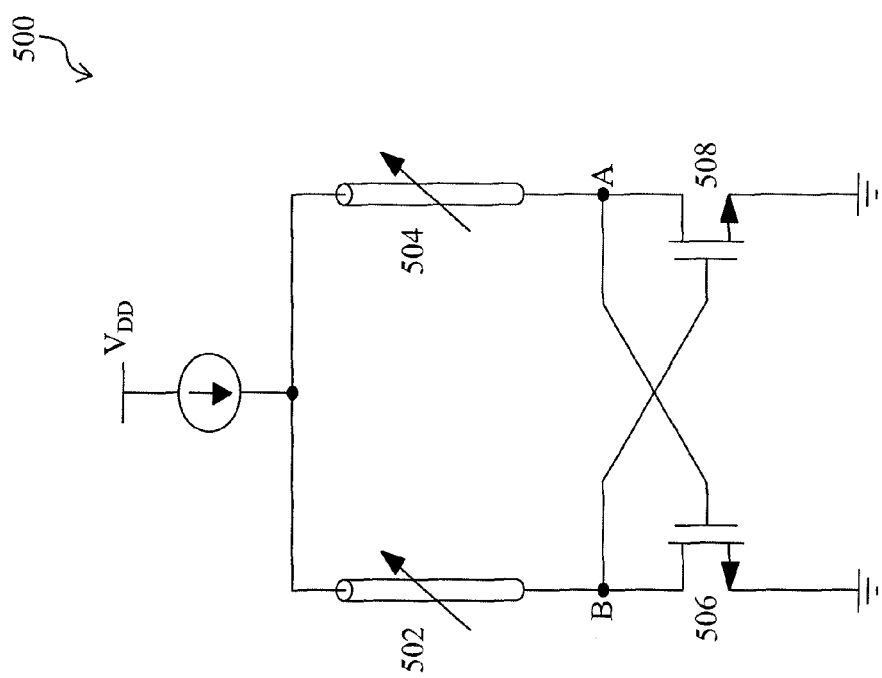
FIG. 5 is a schematic diagram of a voltage controlled oscillator including a varainductor in accordance with one or more embodiments.

FIG. 5 is a schematic diagram of an oscillator circuit 500 including a varainductor in accordance with one or more embodiments. Oscillator circuit 500 includes a first varainductor 502 configured to receive a DC operating voltage and provide inductance for signal oscillation. Oscillator circuit 500 further includes a second varainductor 504 configured to receive a DC operating voltage and provide inductance for signal oscillation. First varainductor 502 is electrically connected in parallel to second varainductor 504. A current source is disposed between first varainductor 502 and the operating voltage VDD and between second varainductor 504 and the operating voltage VDD. First varainductor 502 is connected in series with a first transistor 506. A first terminal of first transistor 506 is connected to first varainductor 502 and a second terminal of first transistor 506 is connected to a reference voltage, e.g. ground. Second varainductor 504 is connected in series with a second transistor 508. A first terminal of second transistor 508 is connected to second varainductor 504 and a second terminal of second transistor 508 is connected to the reference voltage. A gate of first transistor 506 is connected to a first output node A between second varainductor 504 and second transistor 508. A gate of second transistor 508 is connected to a second output node B between first varainductor 502 and first transistor 506. In some embodiments where first varainductor 502 and second varainductor 504 have a structure of varainductor 100 (FIG. 1) or varainductor 400 (FIG. 4), oscillator circuit 500 is a voltage controlled oscillator (VCO) In some embodiments where varainductors 502 and 504 have a structure of varainductor 300 (FIG. 3), oscillator circuit 500 is a digitally controlled oscillator (DCO)

In some embodiments, first varainductor 502 comprises varainductor 100 (FIG. 1). In some embodiments, first varainductor 502 comprises a varainductor other than varainductor 100, such as varainductor 300 (FIG. 3), varainductor 400 (FIG. 4), or another suitable varainductor. In some embodiments, second varainductor 504 comprises varainductor 100. In some embodiment, second varainductor 504 comprises a varainductor other than varainductor 100, such as varainductor 300, varainductor 400, or another suitable varainductor. In some embodiments, first varainductor 502 has a different structure from second varainductor 504.

In some embodiments, first transistor 506 and second transistor 508 are independently selected from p-type metal-oxide-semiconductor (PMOS) transistors, n-type metal-oxide-semiconductor (NMOS) transistors, or other suitable transistors.

Figure 6:
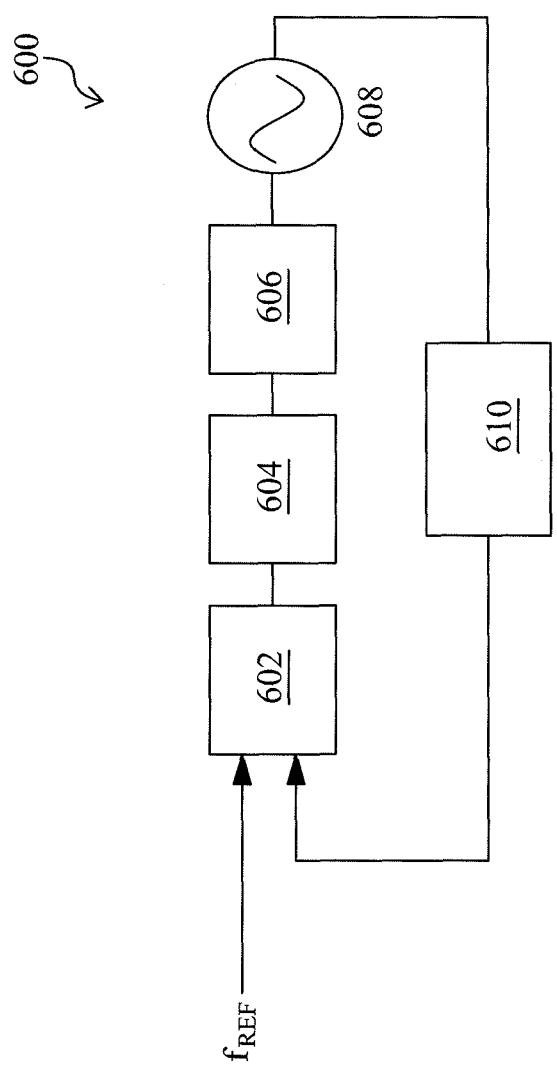
FIG. 6 is a schematic functional diagram of a phase locked loop including a varainductor in accordance with one or more embodiments.

FIG. 6 is a schematic functional diagram of a phase locked loop (PLL) 600 including a varainductor in accordance with one or more embodiments. PLL 600 includes a phase frequency detector (PFD) 602 configured to receive a reference frequency $f_{REF}$ and a feedback frequency $f_{FBK}$. PFD 602 is configured to determine a difference between reference frequency $f_{REF}$ and feedback frequency $f_{FBK}$, and output a first control signal. PLL 600 further includes a charge pump (CP) 604 configured to receive the first control signal. CP 604 is configured to convert the first control signal to an analog voltage signal and output the analog voltage signal. PLL 600 further includes a low pass filter (LPF) 606 configured to receive the analog voltage signal. LPF 606 is configured to remove high frequency components of the analog voltage signal and output a second control signal. PLL 600 further includes an oscillator circuit 608 configured to receive the second control signal. Oscillator circuit 608 is configured to output an output signal LO. Based on the second control signal, oscillator circuit 608 increases or decreases a frequency of the output signal. PLL 600 further includes a feedback frequency divider (FD) 610 configured to receive the output signal. FD 610 is configured to generate feedback frequency $f_{FBK}$, which is a multiple of reference frequency $f_{REF}$.

Oscillator circuit 608 includes a varainductor. In some embodiments, oscillator circuit 608 includes varainductor 100 (FIG. 1), varainductor 300 (FIG. 3), varainductor 400 (FIG. 4), or another suitable varainductor. In some embodiments, oscillator circuit 608 has a structure similar to oscillator circuit 500 (FIG. 5). In some embodiments, the second control signal is the switch control signal Vtune. In some embodiments, the second control signal is received by another circuit configured to generate individual switch control signals for bit control of the varainductor similar to varainductor 300. In some embodiments, oscillator circuit is a VCO. In some embodiments, oscillator circuit 608 is a DCO.

In some embodiments where PLL 600 is included in a receiver device and output signal LO is mixed with a received signal prior to transmission to external circuitry. In some embodiments, the received signal is amplified, e.g., by a low noise amplifier (LNA) prior to mixing with the output signal LO. The mixed output signal is transmitted to other circuits within the receiver device.

Figure 7:
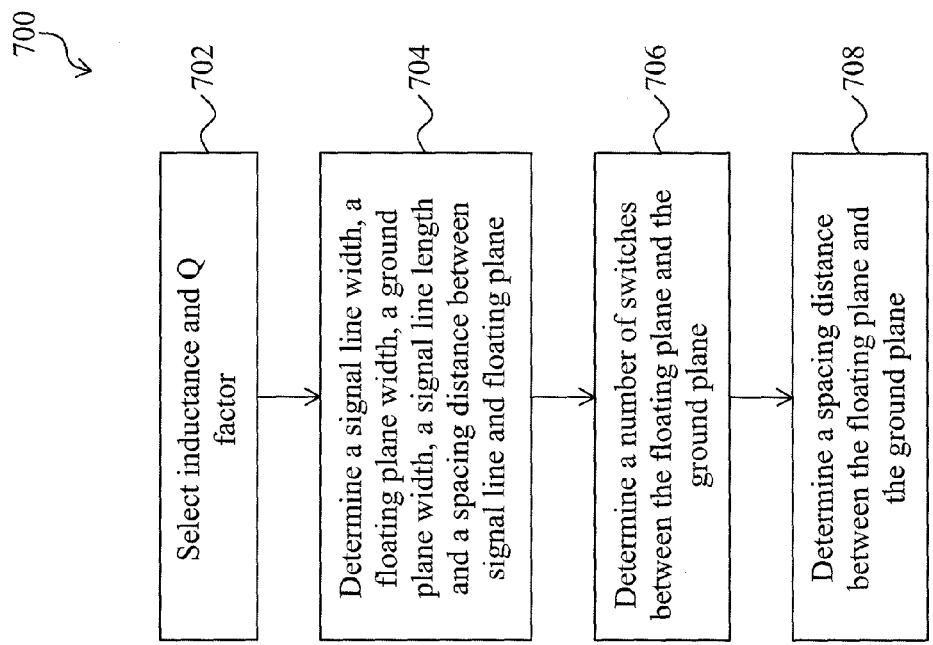
FIG. 7 is a flow chart for method of designing a varainductor in accordance with one or more embodiments.

FIG. 7 is a flow chart for method 700 of designing a varainductor in accordance with one or more embodiments. In operation 702, an inductance and a Q factor for the varainductor are selected. The inductance and Q factor are determined based on a device into which the varainductor is incorporated. As a range of frequencies the device is configured to receive increases, a higher Q factor is selected to enable initiation of oscillation within the varainductor. Similarly, as the range of frequencies increases, a lower inductance of the varainductor is selected.

In operation 704, a width of a signal line, a width of a floating plane, a width of a ground plane, a length of a signal line and a spacing distance between the signal line and the floating plane are determined. The parameters are determined based on the inductance and Q factor of the varainductor selected in operation 702. The relationship between the various parameters and the inductance and Q factor are described in detail above.

In operation 706, a number of switches between the floating plane and the grounding plane is determined. The number of switches is determined based on a critical dimension of a manufacturing process used to form the varainductor. In some embodiments, the number of switches is the maximum number of switches which can be formed along the length of the floating plane based on the manufacturing process. As the number of switches increases, a tuning range of the varainductor increases; however, manufacturing of the varainductor becomes more complex and expensive.

In operation 708, a spacing distance between the floating plane and the ground plane is determined. The spacing distance between the floating plane and the ground plane is determined based on the desired tuning range during operation of the varainductor. As the spacing distance increases, the tuning range increases; however, an area of the varainductor also increases.

Figure 8:
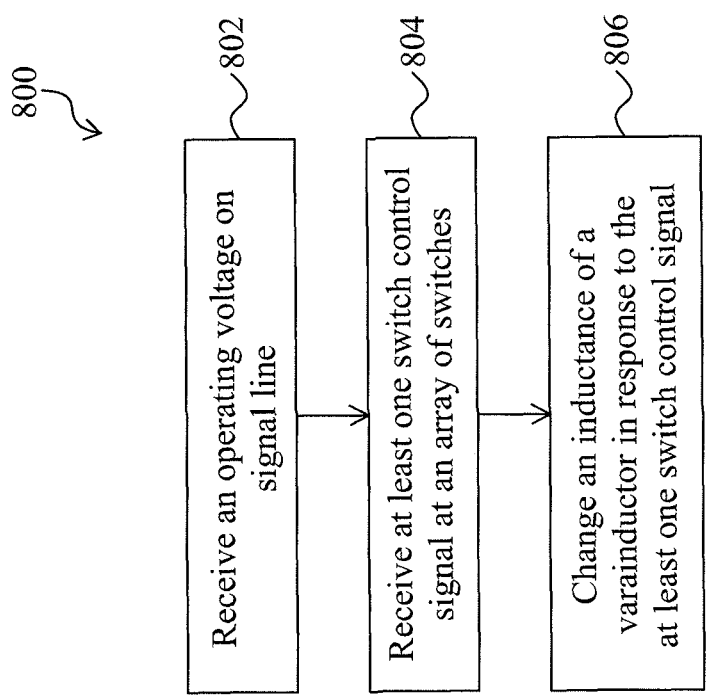
FIG. 8 is a flow chart for a method of operating a varainductor in accordance with one or more embodiments.

FIG. 8 is a flow chart for a method 800 of operating a varainductor in accordance with one or more embodiments. In operation 802, a signal line receives an operating voltage. In some embodiments, the operating voltage is VDD.

In operation 804, an array of switches receives at least one switch control signal. In some embodiments, each switch in the array of switches receives a same switch control signal. In some embodiments, at least one switch in the array of switches receives a different switch control signal from at least another switch in the array of switches. In some embodiments, each switch receives a different switch control signal than every other switch in the array of switches. In some embodiments, the switches of the array of switches are configured to close, i.e., become electrically conductive, in response to a logically high signal. In some embodiments, the switches of the array of switches are configured to open, i.e. become electrically non-conductive, in response to a logically low signal.

In some embodiments, the at least one switch control signal is the second control signal from LPF 606 (FIG. 6). In some embodiments, the at least one switch control signal is a plurality of switch control signals to enable bit control of the switch array. In some embodiments, the plurality of switch control signals is generated by an external circuit configured to receive the second control signal from LPF 606.

In operation 806, an inductance of the varainductor changes in response to the at least one switch control signal. In some embodiments where a number of closed switches increases in response to the at least one switch control signal, the inductance of the varainductor increases. In some embodiments where a number of closed switches decreases in response to the at least one switch control signal, the inductance of the varainductor decreases. In some embodiments where the varainductor in part of an oscillator circuit, an oscillation frequency of the oscillator circuit is configured to increase as the inductance of the varainductor decreases. In some embodiments where the varainductor is part of an oscillator circuit, the oscillation frequency of the oscillator circuit is configured to decrease as the inductance of the varainductor increases.

Figure 9:
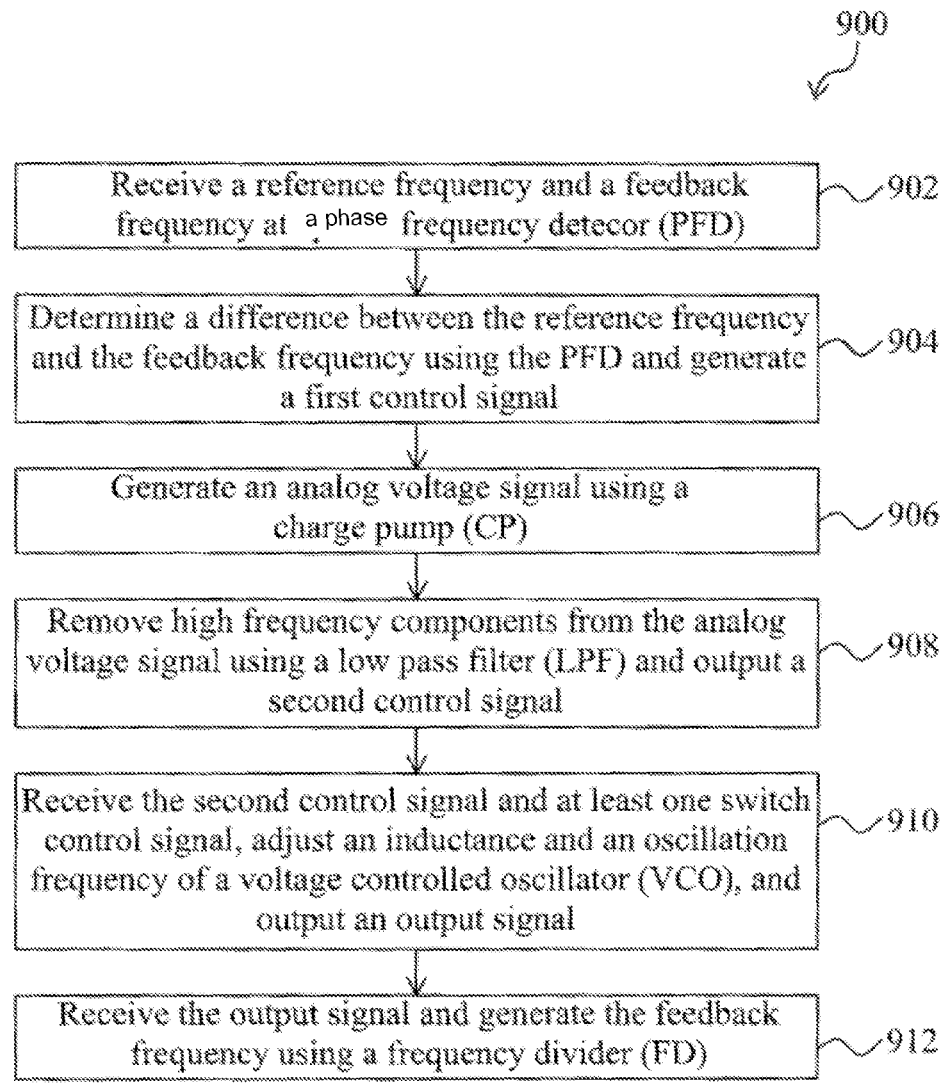
FIG. 9 is a flow chart for a method of operating a phase locked loop including a varainductor in accordance with one or more embodiments.

FIG. 9 is a flow chart for a method 900 of operating a varainductor in accordance with one or more embodiments. In operation 902, a PFD receives a reference frequency. In operation 904, the PFD determines a difference between the reference frequency and a feedback frequency and generates a first control signal. In some embodiments, the first control signal indicates whether an oscillator circuit should increase or decrease frequency oscillation.

In operation 906, a CP generates an analog voltage signal based on the first control signal.

In operation 908, a LPF removes high frequency components from the analog voltage signal and outputs a second control signal.

In operation 910, an oscillator circuit receives the second control signal and at least one switch control signal and adjusts an oscillation frequency of the oscillator circuit. The at least one switch control signal selectively connects a floating plane of a varainductor in the oscillator circuit to a ground plane of the varainductor. In some embodiments where a number of closed switches increases in response to the at least one switch control signal, the inductance of the varainductor increases and an oscillation frequency of the oscillator circuit decreases. In some embodiments where a number of closed switches decreases in response to the at least one switch control signal, the inductance of the varainductor decreases and the oscillation frequency of the oscillator circuit increases. In some embodiments, the at least one switch control signal is the second control signal from operation 908. In some embodiments, the at least one switch control signal is generated by an additional controller circuit configured to receive the second control signal and output the at least one switch control signal. In some embodiments, the at least one switch control signal is configured to be a plurality of switch control signals for bit control the electrical connection between the floating plane and the ground plane.

In operation 912, a FD receives a portion of the output signal and generates the feedback frequency. The feedback frequency is received by the PFD.

One aspect of this description relates to a varainductor. The varainductor includes a signal line over a substrate, the signal line having a length extending in a first direction and a width extending in a second direction perpendicular to the first direction. The varainductor further includes a first ground plane over the substrate, the first ground plane disposed on a first side of the signal line, wherein the first ground plane has a length in the first direction and a width in the second direction. The varainductor further includes a second ground plane over the substrate, the second ground plane disposed on a second side of the signal line opposite the first side of the signal line in the second direction, wherein the second ground plane has a length in the first direction and a width in the second direction. The varainductor further includes a first floating plane over the substrate, the first floating plane disposed between the first ground plane and the signal line, wherein the first floating plane has a length in the first direction and a width in the second direction. The varainductor further includes a second floating plane over the substrate, the second floating plane disposed between the second ground plane and the signal line, wherein the second floating plane has a length in the first direction and a width in the second direction. The varainductor further includes an array of switches, the array of switches is configured to selectively connect the first ground plane to the first floating plane, and to selectively connect the second ground plane to the second floating plane.

Another aspect of this description relates to an oscillator circuit. The oscillator circuit includes a first varainductor configured to receive an operating voltage and a second varainductor configured to receive the operating voltage, wherein the second varainductor is electrically connected in parallel with the first varainductor. The oscillator circuit further includes a first transistor having a first terminal connected to the first varainductor and a second transistor having a first terminal connected to the second varainductor.

Still another aspect of this description relates to a phase locked loop (PLL). The PLL includes a phase frequency detector (PFD) configured to receive a reference frequency and a feedback frequency, the PFD configured to generate a first control signal. The PLL further includes a charge pump (CP) configured to receive the first control signal and generate an analog voltage signal and a low pass filter (LPF) configured to receive the analog voltage signal and generate a second control signal. The PLL further includes an oscillator circuit configured to receive the second control signal and generate and output signal. The oscillator circuit includes a first varainductor configured to receive an operating voltage and a second varainductor configured to receive the operating voltage, wherein the second varainductor is electrically connected in parallel with the first varainductor. The oscillator circuit further includes a first transistor having a first terminal connected to the first varainductor and a second transistor having a first terminal connected to the second varainductor. The PLL further includes a frequency divider (FD) configured to receive the output signal and generate the feedback frequency.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A varainductor comprising:
   a signal line over a substrate, the signal line having a length extending in a first direction and a width extending in a second direction perpendicular to the first direction;
   a first ground plane over the substrate, the first ground plane disposed on a first side of the signal line, wherein the first ground plane has a length in the first direction and a width in the second direction;
   a second ground plane over the substrate, the second ground plane disposed on a second side of the signal line opposite the first side of the signal line in the second direction, wherein the second ground plane has a length in the first direction and a width in the second direction, wherein
   at least one of the first ground plane or the second ground plane comprises:
      a plurality of conductive layers displaced from one another in a direction perpendicular to a surface of the substrate; and
      at least one via electrically connecting adjacent conductive layers of the plurality of conductive layers;
   a first floating plane over the substrate, the first floating plane disposed between the first ground plane and the signal line, wherein the first floating plane has a length in the first direction and a width in the second direction;
   a second floating plane over the substrate, the second floating plane disposed between the second ground plane and the signal line, wherein the second floating plane has a length in the first direction and a width in the second direction; and
   an array of switches, the array of switches is configured to selectively electrically connect the first ground plane to the first floating plane, and to selectively electrically connect the second ground plane to the second floating plane.

2. The varainductor of claim 1, wherein each switch of the array of switches is configured to receive a same switch control signal.

3. The varainductor of claim 1, wherein at least one switch of the array of switches is configured to receive a different switch control signal from at least another switch of the array of switches.

4. The varainductor of claim 1, wherein the length of the signal line, the length of the first ground plane, the length of the second ground plane, the length of the first floating plane and the length of the second floating plane are substantially equal.

5. The varainductor of claim 1, wherein the width of the signal line ranges from about 2 micrometers (μm) to about 6 μm.

6. The varainductor of claim 1, wherein the width of the second ground plane is substantially equal to the width of the first ground plane, and the width of the second ground plane ranges from about 4 μm to about 30 μm.

7. The varainductor of claim 1, wherein the width of the first floating plane is substantially equal to the width of the second floating plane, and the width of the first floating plane ranges from about 2 μm to about 30 μm.

8. The varainductor of claim 1, wherein the first floating plane is spaced from the first ground plane by a distance ranging from about 2 μm to about 30 μm, and the second floating plane is spaced from the second ground plane by a distance ranging from about 2 μm to about 30 μm.

9. The varainductor of claim 1, wherein the first floating plane is spaced from the signal line by a distance ranging from about 2 μm to about 30 μm, and the second floating plane is spaced from the signal line by a distance ranging from about 2 μm to about 30 μm.

10. The varainductor of claim 1, further comprising a shielding layer disposed between the signal line and the substrate.

11. The varainductor of claim 10, wherein at least one of the first floating plane or the second floating plane is electrically connected to the shielding layer.

12. The varainductor of claim 10, wherein the shielding layer is a slot-type shielding layer, or a solid shielding layer.

13. The varainductor of claim 1, wherein the signal line, the first ground plane, the second ground plane, the first floating plane, and the second floating plane are disposed a substantially equal distance above the substrate.

14. An oscillator circuit comprising:
a first varainductor configured to receive a dc operating voltage and signal;
a second varainductor configured to receive the dc operating voltage and signal, wherein the second varainductor is electrically connected in parallel with the first varainductor, and at least one of the first varainductor or the second varainductor comprises:
a signal line over a substrate, the signal line having a length extending in a first direction and a width extending in a second direction perpendicular to the first direction;
a first ground plane over the substrate, the first ground plane disposed on a first side of the signal line, wherein the first ground plane has a length in the first direction and a width in the second direction;
a second ground plane over the substrate, the second ground plane disposed on a second side of the signal line opposite the first side of the signal line in the second direction, wherein the second ground plane has a length in the first direction and a width in the second direction, wherein
at least one of the first ground plane or the second ground plane comprises:
a plurality of conductive layers displaced from one another in a direction perpendicular to a surface of the substrate, and
at least one via electrically connecting adjacent conductive layers of the plurality of conductive layers;
a first floating plane over the substrate, the first floating plane disposed between the first ground plane and the signal line, wherein the first floating plane has a length in the first direction and a width in the second direction;
a second floating plane over the substrate, the second floating plane disposed between the second ground plane and the signal line, wherein the second floating plane has a length in the first direction and a width in the second direction; and
an array of switches, the array of switches is configured to selectively electrically connect the first ground plane to the first floating plane, and to selectively electrically connect the second ground plane to the second floating plane, wherein
the signal line is configured as part of a path between the dc operating voltage and ground; and
the array of switches is electrically insulated from the signal line, an inductance level of the at least one of the first varainductor or the second varainductor being adjustable by a configuration of the switch;
a first transistor having a first terminal electrically connected to the first varainductor; and
a second transistor having a first terminal electrically connected to the second varainductor.

15. The oscillator circuit of claim 14, further comprising a shielding layer disposed between the signal line and the substrate.

16. The oscillator circuit of claim 14, wherein the oscillator circuit is a digital controlled oscillator (DCO), and a switch of the array of switches is configured to receive a different switch control signal from at least another switch of the array of switches.

17. The oscillator circuit of claim 14, wherein a gate of the first transistor is electrically connected to the first terminal of the second transistor, and a gate of the second transistor is electrically connected to the first terminal of the first transistor.

18. A phase locked loop (PLL) comprising:
a phase frequency detector (PFD) configured to receive a reference frequency and a feedback frequency, the PFD configured to generate a first control signal;
a charge pump (CP) configured to receive the first control signal and generate an analog voltage signal;
a low pass filter (LPF) configured to receive the analog voltage signal and generate a second control signal;
an oscillator circuit configured to receive the second control signal and generate an output signal, the oscillator circuit comprising:
a first varainductor configured to receive an operating voltage;
a second varainductor configured to receive the operating voltage, wherein the second varainductor is electrically connected in parallel with the first varainductor, and wherein the first varainductor comprises:
a first signal line over a substrate, the first signal line having a length extending in a first direction and a width extending in a second direction perpendicular to the first direction;
a first ground plane over the substrate, the first ground plane disposed on a first side of the first signal line, wherein the first ground plane has a length in the first direction and a width in the second direction;

a second ground plane over the substrate, the second ground plane disposed on a second side of the first signal line opposite the first side of the first signal line in the second direction, wherein the second ground plane has a length in the first direction and a width in the second direction;

a first floating plane over the substrate, the first floating plane disposed between the first ground plane and the first signal line, wherein the first floating plane has a length in the first direction and a width in the second direction;

a second floating plane over the substrate, the second floating plane disposed between the second ground plane and the first signal line, wherein the second floating plane has a length in the first direction and a width in the second direction; and a first array of switches, wherein the first array of switches includes at least two switches, wherein each switch of the first array of switches is configured to selectively electrically connect the first ground plane to the first floating plane; and a second array of switches, wherein the second array of switches includes at least two switches, wherein each switch of the second array of switches is configured to selectively electrically connect the second ground plane to the second floating plane, wherein the first signal line is configured as part of a path between the operating voltage and ground, and the first and second arrays of switches are electrically insulated from the first signal line, an inductance level of the first varainductor being adjustable by a configuration of the switch;

a first transistor having a first terminal electrically connected to the first varainductor; and a second transistor having a first terminal electrically connected to the second varainductor; and a frequency divider (FD) configured to receive the output signal and generate the feedback frequency.

19. The PLL of claim 18, wherein the second varainductor comprises:

a second signal line over the substrate;

a third ground plane over the substrate, the third ground plane disposed on a side of the second signal line;

a third floating plane over the substrate, the third floating plane disposed between the third ground plane and the second signal line; and a third array of switches configured to selectively electrically connect the third ground plane to the third floating plane.

* * * * *